United States Patent [19]

Teratani

[11] Patent Number: 4,833,570
[45] Date of Patent: May 23, 1989

[54] ELECTRONIC CIRCUIT ASSEMBLY

[75] Inventor: Tatsuo Teratani, Aichi, Japan

[73] Assignee: Toyota Jidosha Kabushiki Kaisha, Aichi, Japan

[21] Appl. No.: 116,662

[22] Filed: Nov. 3, 1987

[30] Foreign Application Priority Data

Dec. 16, 1986 [JP] Japan .................. 61-300568
Dec. 16, 1986 [JP] Japan .................. 61-193881[U]
Dec. 16, 1986 [JP] Japan .................. 61-193882[U]

[51] Int. Cl.⁴ .................................... H05K 1/18
[52] U.S. Cl. ........................... 361/403; 174/68.5; 174/138 G; 361/417
[58] Field of Search ........... 174/138 G, 152 PE, 68.5; 361/403, 417, 418, 419, 420

[56] References Cited

U.S. PATENT DOCUMENTS

| | | | |
|---|---|---|---|
| 2,904,617 | 9/1959 | King | 174/138 G X |
| 3,087,982 | 4/1963 | Hayes | 174/138 G |
| 3,366,914 | 1/1968 | McManus | 174/138 G |
| 3,469,148 | 9/1969 | Lund | 361/400 |
| 3,590,348 | 6/1971 | Bertics | 174/138 G |
| 3,652,333 | 3/1972 | Warren | 174/52 PE |
| 4,300,184 | 11/1981 | Colla | 174/52 PE X |
| 4,480,289 | 10/1984 | Huffman | 174/138 G X |

FOREIGN PATENT DOCUMENTS 59-123291 7/1984 Japan .
59-107166 7/1984 Japan .

OTHER PUBLICATIONS

Bivar Inc., DISSO-O-PAD pamphlet, Oct. 1969, Santa Ana, Calif., 4 pages.

Primary Examiner—R. R. Kucia
Attorney, Agent, or Firm—Oliff & Berridge

[57] ABSTRACT

An electronic circuit assembly includes a printed cirucit base plate, an electronic circuit element, a spacer and a coating resin. The electronic circuit element includes an IC housing and a plurality of lead pins. The plurality of lead pins are electrically connected and secured to the printed circuit base plate such that the IC housing is spaced apart from the printed circuit base plate. The spacer is located between the printed circuit base plate and the IC housing. The coating resin coats the printed circuit base plate, a portion of the spacer and a portion of the lead pins of the electronic circuit element.

20 Claims, 17 Drawing Sheets

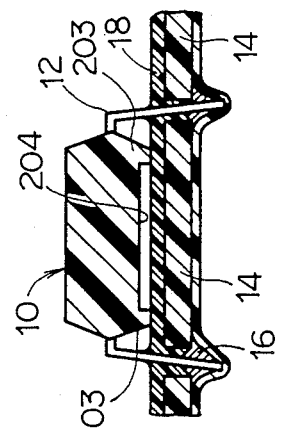
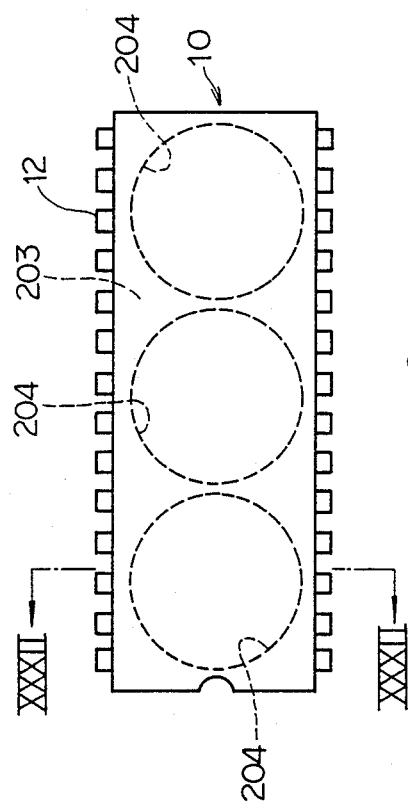
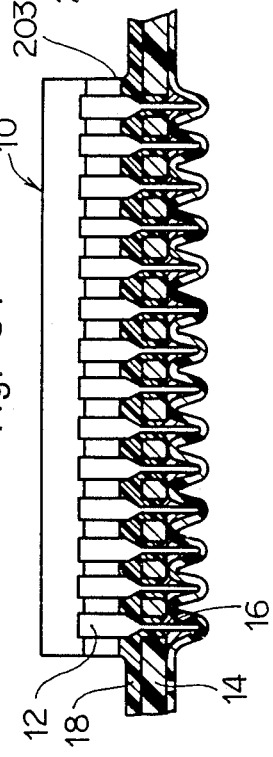

ELECTRONIC CIRCUIT ASSEMBLY

BACKGROUND OF THE INVENTION

The present invention relates to an electronic circuit assembly which includes a printed circuit base plate and an electronic circuit element.

More particularly, the present invention relates to improvements in an electronic circuit assembly which is coated with coating material (e.g., plastic resin).

A conventional electronic circuit assembly includes an electronic circuit element and a printed circuit base plate. The electronic circuit element includes a body portion and a plurality of lead pins. The body portion is protected by a molded plastic housing. The plurality of lead pins extend from the body portion and connect the electronic circuit element to the printed circuit base plate.

FIGS. 1 through 3 show a conventional dual in line (DIP) package constituting the electronic circuit element. Such an electronic circuit element includes a housing 10 for an IC constituting the body portion and a plurality of "L" shaped lead pins 12 which extend laterally from the IC housing 10 are bent substantially perpendicularly, as shown in FIG. 3. The lead pins 12 are inserted into holes defined within a printed circuit base plate (not shown in drawings). The lead pins 12 are electrically connected and secured to the printed circuit base plate by soldering.

However, such an electronic circuit element is easily damaged by heat. To prevent thermal damage to electronic circuit element, the electronic circuit element should be placed from the surface of the printed circuit base plate.

To provide such spacing, the lead pins 12 include tapered portions 121 thereon, so that each lead pin 12 has a tip portion which is thinner than a base portion, as shown in FIG. 2. When the tip portions of the lead pins 12 are inserted into the holes defined in the printed circuit base plate, the tapered portions 121 prevent the base portions of the lead pins 12 from being inserted into the corresponding holes. As a consequence, the IC housing 10 is spaced at a predetermined distance from the printed circuit base plate by the tapered portions 121 of the lead pins 12.

Further, to make the electronic circuit assembly water proof and dust resistant, the electronic circuit assembly is coated with an acrylic resin, or the like, as disclosed in Laid-Open Japanese Utility Model application No. 59-107166. However, when such an electronic circuit assembly is coated with a plastic resin, the plastic resin enters the space defined between the IC housing 10 and the printed circuit base plate. When the plastic resin hardens within the space, it shrinks and pulls the IC housing 10 toward the printed circuit base plate. As a result, the lead pins 12 are subjected to a mechanical strain, which degrades the connecting condition between the lead pins 12 and the printed circuit base plate.

SUMMARY OF THE INVENTION

The present invention was developed to overcome the foregoing drawbacks of conventional electronic circuit assemblies. It is accordingly an object of this invention to provide an electronic circuit assembly which has less thermal and mechanical strain on the lead pins thereof.

To achieve the foregoing object, the electronic circuit assembly of the present invention includes a printed circuit base plate, an electronic circuit element, a spacer means and a coating means. The electronic circuit element includes a body portion and a plurality of lead pins extending from the body portion. The body portion of the electronic circuit element is spaced apart a predetermined distance from the printed circuit base plate, and the lead pins are electrically connected and secured to the printed circuit base plate. The spacer means is positioned in supporting relationship between the printed circuit base plate and the body portion of the electronic circuit element, and the coating means coats the printed circuit base plate, a portion of the spacer means and a portion of each lead pin of the electronic circuit element.

Accordingly, even if the the coating means shrinks, the electronic circuit assembly has less thermal and mechanical strain, because the spacer means prevents the coating means from contacting the under surface of the body portion of the electronic circuit element. Further, the lead pins of the electronic circuit assembly are securely connected to the printed circuit base plate without thermal or mechanical strain, even if the electronic circuit assembly is coated with a coating means.

BRIEF DESCRIPTION OF THE DRAWINGS

The above objects, features and advantages of the present invention will become more apparent from the following description of preferred embodiments of the invention, taken in conjunction with the accompanying drawings, wherein like reference numerals denote like elements:

FIG. 30 is a partial top view of a thirteenth embodiment of an electronic circuit assembly according to the present invention, wherein recesses are shown in phantom line;

FIG. 31 is a side view, partially in cross-section, of the electronic circuit assembly shown in FIG. 30;

FIG. 32 is a cross-sectional view of the electronic circuit assembly shown in FIG. 30 taken along the line XXXII—XXXII;

DETAILED DESCRIPTION OF THE PREFERRED EMBODIMENTS

The present invention will be described in detail with reference to the accompanying drawings which illustrate preferred embodiments according to the present invention.

Figures 1, 2, 3:
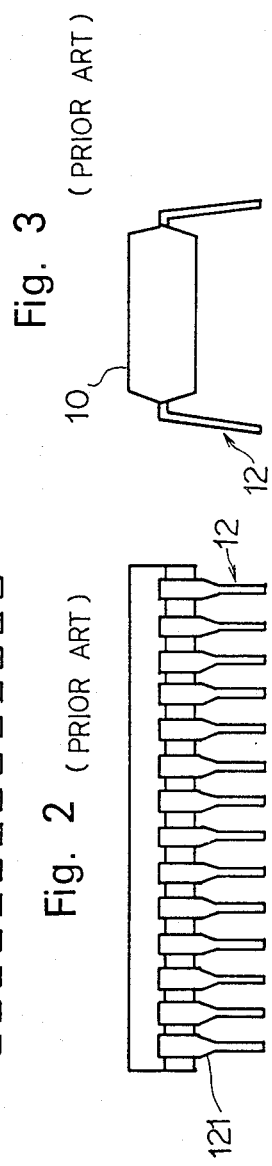
FIG. 1 is a top view of a conventional electronic circuit element.
FIG. 2 is a side view of the conventional electronic circuit element shown in FIG. 1.
FIG. 3 is a front view of the conventional electronic circuit element shown in FIG. 1.
Figure 4:
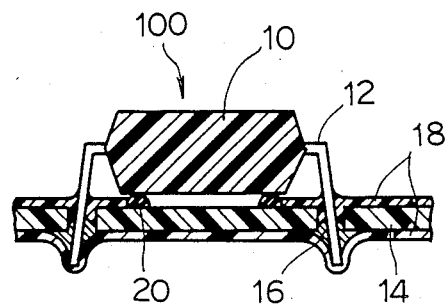
FIG. 4 is a cross-sectional view of a first embodiment of an electronic circuit assembly according to the present invention, wherein an electronic circuit element of the electronic circuit assembly is secured to a printed circuit base plate, and coated by a plastic resin.

Referring to FIG. 4, which shows a first embodiment, a dual in line (DIP) IC package 100 constituting an electronic circuit element includes an IC housing 10 as a body portion and a plurality of lead pins 12. Each lead pin 12 has a cross-sectional "L" shape, so that it extends from the IC housing 10 first in a lateral direction and then bends downwardly, as shown.

Each lead pin 12 is secured and electrically connected to a printed circuit base plate 14 by solder 16. A tip of each lead pin 12 is inserted into a hole defined in the printed circuit base plate 14, and is secured to a back surface of the printed circuit base plate 14 by the solder 16. A front surface and the back surface of the printed circuit base plate 14 are covered with a coating resin 18 constituting a coating means to protect the printed circuit base plate 14 and a connecting portion between the lead pins 12 and the printed circuit base plate 14 from water and dust.

Figure 5:
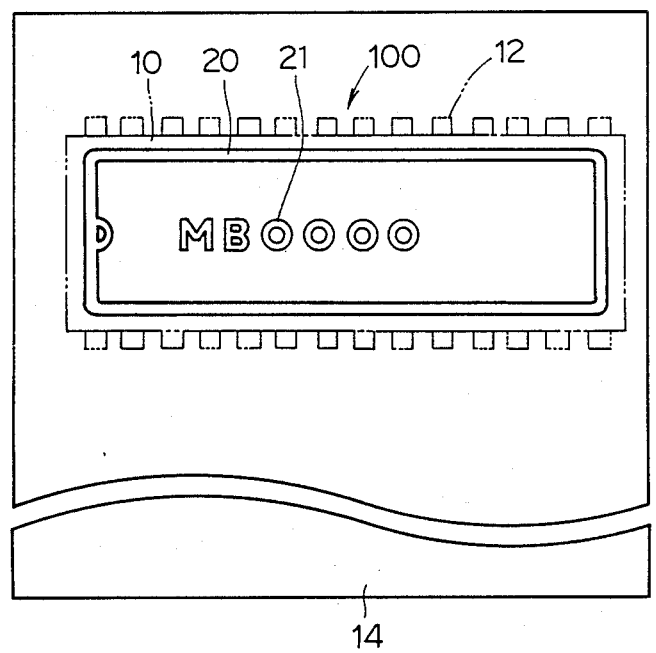
FIG. 5 is a top view of the printed circuit base plate of the embodiment of FIG. 4, wherein the electronic circuit element to be positioned on the printed circuit base plate is shown in phantom line.

As shown in FIG. 5, a support member 20 made of elastomeric material and constituting a spacer means is positioned on the front surface of the printed circuit base plate 14. The support member 20 can include alphanumeric indicia 21, as shown, which indicate a predetermined position for mounting the IC package 100 (shown in phantom line) on the printed circuit base plate 14.

The uncompressed thickness of the support member 20 is greater than a predetermined spacing between the IC housing 10 and the printed circuit base plate 14, i.e., the support member 20 is compressingly positioned between the IC housing 10 and the printed circuit base plate 14. When the electronic circuit element 100 is mounted on the support member 20 and the lead pins 12 are secured to the printed circuit base plate 14 by the solder 16, the IC housing 10 closely contacts the support member 20. Consequently, the support member 20 forms an enclosed space with the IC housing 10, and prevents the coating resin 18 from entering into the enclosed space.

As a result, even if the coating resin 18 shrinks during the drying process, the predetermined spacing defined between the IC housing 10 and the printed circuit base plate 14 cannot be decreased. Therefore, the connection condition between the lead pins 12 and the printed circuit base plate 14 is not degraded by the shrinking of the coating resin 18.

Figure 6:
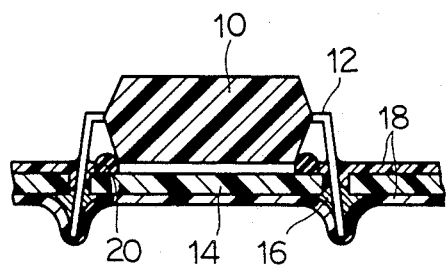
FIG. 6 is a cross-sectional view of a second embodiment of an electronic circuit assembly according to the present invention.
Figure 7:
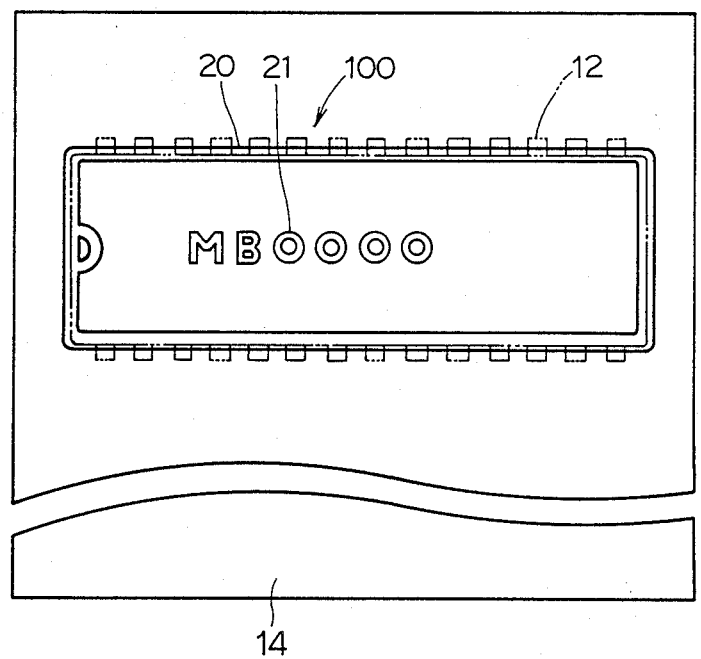
FIG. 7 is a top view of the printed circuit base plate of the second embodiment, wherein the electronic circuit element is shown in phantom line.

FIGS. 6 and 7 show a second embodiment of the present invention, which is very similar to the first embodiment described above. As shown, the difference is that the dimensions of the enclosed space defined between the IC housing 10, the printed circuit base plate 14 and the support member 20 are slightly greater than the corresponding dimensions of the under surface of the IC housing 10, such that a bottom portion of the IC housing 10 is slightly seated within the enclosed space, with the sides of the IC housing 10 surrounded by and securely in contact with the support member 20. Further, as shown, the support member advantageously extends higher than the spacing between the upper surface of the IC housing 10 and the opposing surface of the printed circuit base plate 14.

When the electronic circuit element 100 is mounted on the support member 20 and the lead pins 12 are secured to the printed circuit base plate 14 by the solder 16, the IC housing 10 closely contacts the support member 20. Consequently, the support member 20 forms the enclosed space with the IC housing 10, and prevents the coating resin 18 from entering into the enclosed space. As a result, similarly to the first embodiment, even if the coating resin 18 shrinks during the drying process, the predetermined spacing defined between the IC housing 10 and the printed circuit base plate 14 cannot be shortened. Therefore, the connection condition between the lead pins 12 and the printed circuit base plate 14 is not degraded by the shrinking of the coating resin 18.

Figure 10:
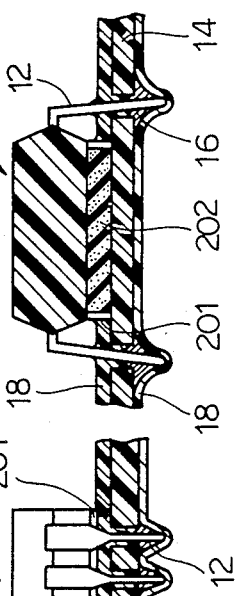
FIG. 10 is a cross-sectional view of the electronic circuit assembly shown in FIG. 8 taken along the line X—X.
Figure 8:
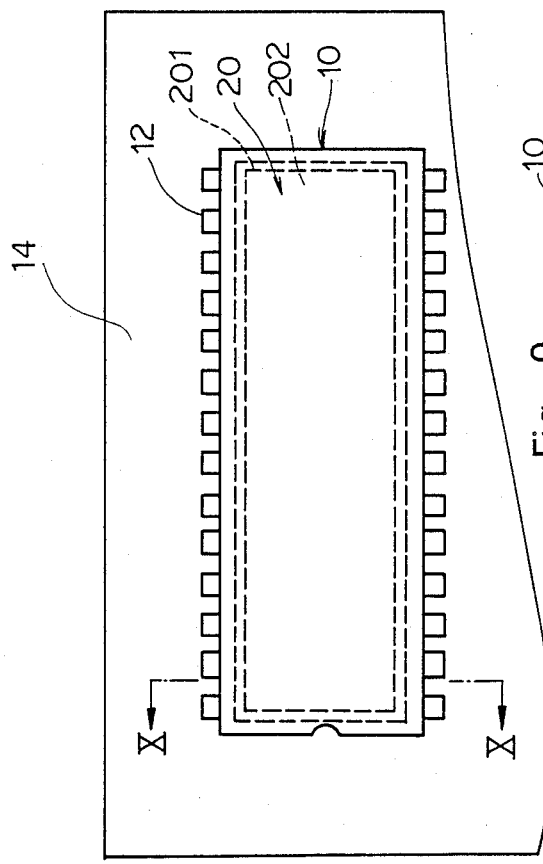
FIG. 8 is a top view of a third embodiment of an electronic circuit assembly according to the present invention, wherein a spacer is shown in phantom line.
Figure 9:
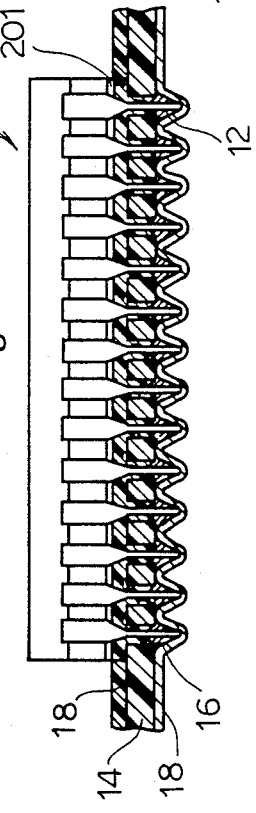
FIG. 9 is a side view, partially in cross-section, of the electronic circuit assembly shown in FIG. 8.

FIGS. 8, 9 and 10 show a third embodiment of the present invention, which is similar to the first embodiment disclosed in FIGS. 4 and 5. The difference is that the support member, or spacer 20 includes a stress absorbing portion 202 constituting a stress absorbing means and a protective layer 201 constituting a protector means.

The stress absorbing portion 202 has a plate shape, advantageously is made from paper or a sponge material, and contacts the entire under surface of the IC housing 10. The stress absorbing portion 202 absorbs the mechanical stress caused by shrinkage of the coating resin 18. The stress absorbing portion 202 also has a low thermal conductively, so that it also prevents the IC housing 10 from incurring thermal damage. The stress absorbing portion 202 advantageously has a 0.1 through 1.0 mm thickness. The protective layer 201 advantageously is made from a vinyl coating or wax or the like, covers the side surfaces of the stress absorbing portion 202, and prevents the stress absorbing portion 202 from absorbing the coating resin 18, which can be made from acrylic resin and the like.

Consequently, the stress absorbing portion 202 does not absorb the coating resin 18, is not hardened during the drying process, and maintains its stress absorbing function. As a result, the predetermined distance between the under surface of the IC housing 10 and the opposing surface of the printed circuit base plate 14 is maintained by the spacer 20, and the connecting condition between the lead pin 12 and the printed circuit base plate 14 is not degraded.

The coating resin 18 advantageously has a 10 through 100 u m thickness.

Figure 12:
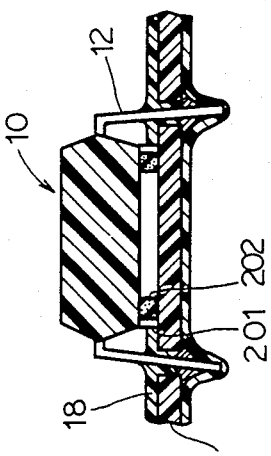
FIG. 12 is a cross-sectional view of the electronic circuit assembly shown in FIG. 11 taken along the line XII—XII.
Figure 11:
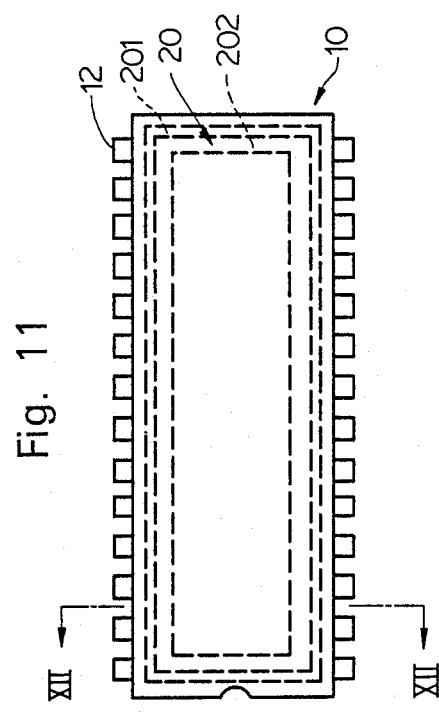
FIG. 11 is a partial top view of a fourth embodiment of an electronic circuit assembly according to the present invention, wherein a spacer is shown in phantom line.

FIGS. 11 and 12 show a fourth embodiment of the present invention, which is very similar to the third embodiment described above. The difference is that the stress absorbing portion 202 of the spacer 20 has a hollow rectangular frame shape, as shown in FIG. 11, and contacts only a peripheral portion of the under surface of the IC housing 10. Consequently, a space is defined between the under surface of the IC housing 10, the printed circuit base plate 14 and the stress absorbing portion 202 of the spacer 20, similarly to the first embodiment. The protective layer 201 covers the outer side of the stress absorbing portion 202 and contacts the under surface of the IC housing 10, as shown. As a result, the predetermined distance between the under surface of the IC housing 10 and the opposing surface of the printed circuit base plate 14 is maintained by the spacer 20, and the connecting condition between the lead pins 12 and the printed circuit base plate 14 is not degraded.

Figure 14:
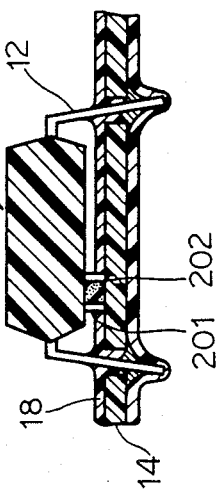
FIG. 14 is a cross-sectional view of the electronic circuit assembly shown in FIG. 13 taken along the line XIV—XIV.
Figure 13:
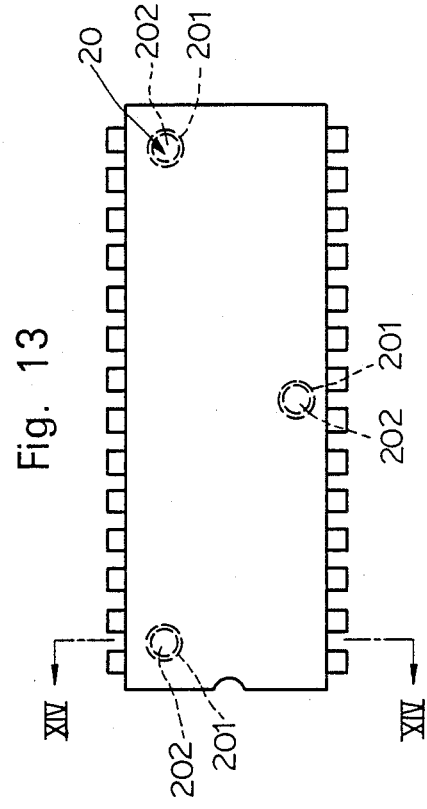
FIG. 13 is a partial top view of a fifth embodiment of an electronic circuit assembly according to the present invention, wherein a spacer is shown in phantom line.

FIG. 13 and 14 show a fifth embodiment of the present invention, which is similar to the third embodiment shown in FIGS. 8, 9 and 10. The difference is that the spacer 20 comprises three columns positioned between the under surface of the IC housing 10 and the base plate 14. Each column includes a stress absorbing portion 202, and a protective layer 201 which covers the columnar surface of the corresponding stress absorbing portion 202, as shown. A first column advantageously is located in the vicinity of the center adjacent a first side of the IC housing 10, and the other columns advantageously are located respectively in the vicinity of the corners of a second side of the IC housing 10, as shown.

Consequently, the IC housing 10 is securely supported on the printed circuit base plate 14 by the three columns of the spacer 20. Further, the three columns are covered by the protector layers 201, the predetermined distance between the under surface of the IC housing 10 and the opposing surface of the printed circuit base plate 14 is maintained by the spacer 20, and the connecting condition between the lead pins 12 and the printed circuit base plate 14 is not degraded.

Figure 15:
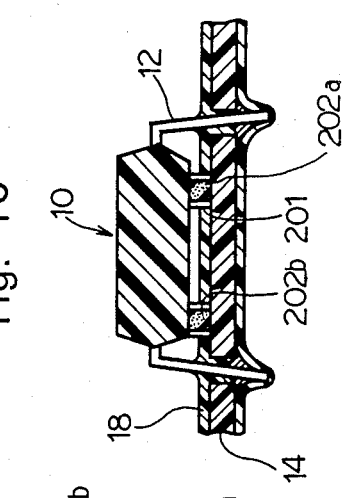
FIG. 15 is a partial top view of a sixth embodiment of an electronic circuit assembly according to the present invention, wherein a spacer is shown in phantom line.
Figure 16:
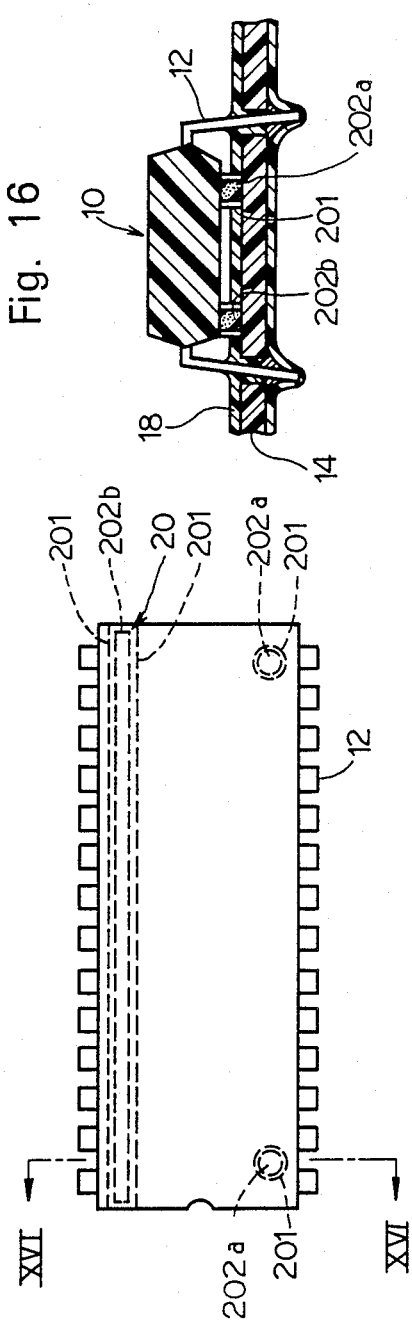
FIG. 16 is a cross-sectional view of the electronic circuit assembly shown in FIG. 15 taken along the line XVI—XVI.

FIGS. 15 and 16 show a sixth embodiment of the present invention, which is very similar to the fifth embodiment described above. The difference is that the spacer 20 includes two stress absorbing columns 202a and a stress absorbing slender elongated member 202b, which each includes a protector convering layer 201. The slender member 202b and the columns 202a of the spacer 20 are positioned between the under surface of the IC housing 10 the printed circuit base plate 14. The slender member 202b advantageously is located near a first side of the IC housing 10, and the columns 202a advantageously are located respectively in the vicinity of the corners of a second side of the IC housing 10.

Consequently, the IC housing 10 is securely supported on the printed circuit base plate 14 by the slender member 202b and the columns 202a of the spacer 20, the predetermined distance between the under surface of the IC housing 10 and the opposing surface of the printed circuit base plate 14 is maintained by the spacer 20, and the connecting condition between the lead pins 12 and the printed circuit base plate 14 is not degraded.

Figure 17:
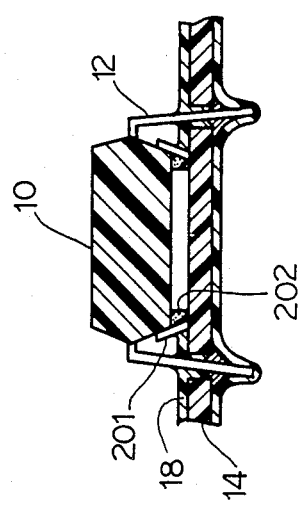
FIG. 17 is a partial top view of a seventh embodiment of an electronic circuit assembly according to the present invention, wherein a spacer is shown in phantom line.
Figure 18:
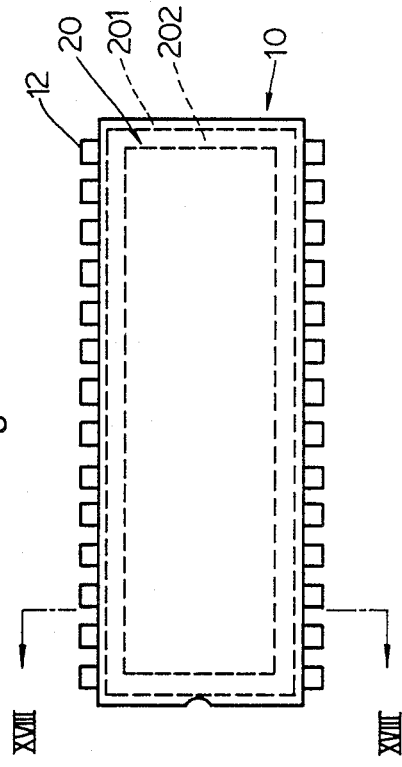
FIG. 18 is a cross-sectional view of the electronic circuit assembly shown in FIG. 17 taken along the line XVIII—XVIII.

FIGS. 17 and 18 show a seventh embodiment of the present invention, which is very similar to the fourth embodiment disclosed in FIGS. 11 and 12. The difference is that the protective layer 201 of the spacer 20 covers both the sides of the stress absorbing portion 202 of the spacer 20 and the lower walls of the IC housing 10. Since the protective layer 201 overlaps a portion of the IC housing 10, the spacer 20 is secured to the IC housing 10 before the IC housing 10, is secured to the printed circuit base plate 14 by the solder 16. Further, the protective layer 201 completely prevents the coating resin 18 from penetrating between the IC housing 10 and the spacer 20.

As a result, the predetermined distance between the under surface of the IC housing 10 and the front surface of the printed circuit base plate 14 is maintained by the spacer 20, and the connecting condition between the lead pins 12 and the printed circuit base plate 14 is not degraded.

Figure 20:
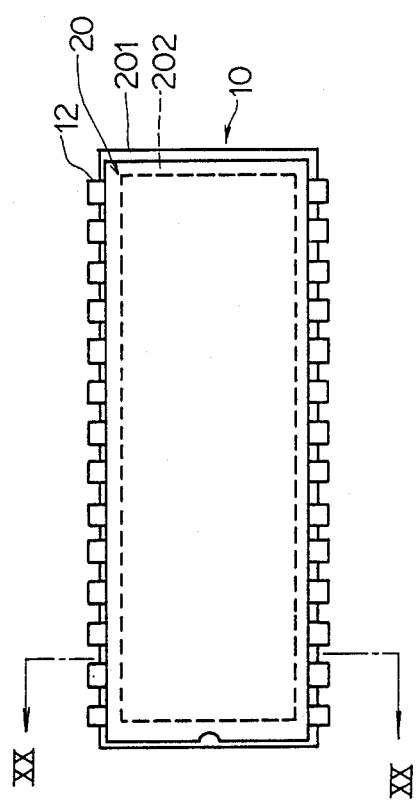
FIG. 20 is a cross-sectional view of the electronic circuit assembly shown in FIG. 19 taken along the line XX—XX.
Figure 19:
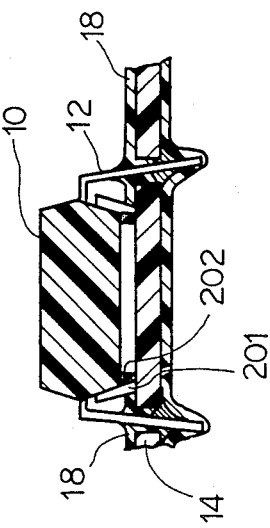
FIG. 19 is a partial top view of an eighth embodiment of an electronic circuit assembly according to the present invention, wherein an inner edge of a spacer is shown in phantom line.

FIGS. 19 and 20 show an eighth embodiment of the present invention, which is very similar to the seventh embodiment described above The difference is that the protective layer 201 extends upwardly further, so as to overlap more of the lower walls of the IC housing, than in the seventh embodiment.

Consequently, the protective layer 201 adheres on the IC housing 10 more securely.

Figure 23:
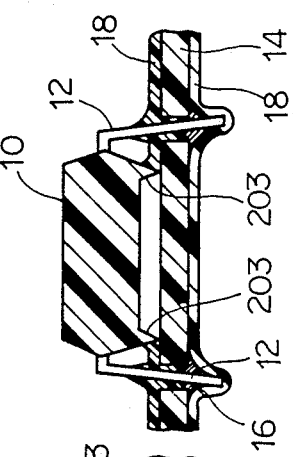
FIG. 23 is a cross-sectional view of the electronic circuit assembly shown in FIG. 21 taken along the line XXIII—XXIII.
Figure 21:
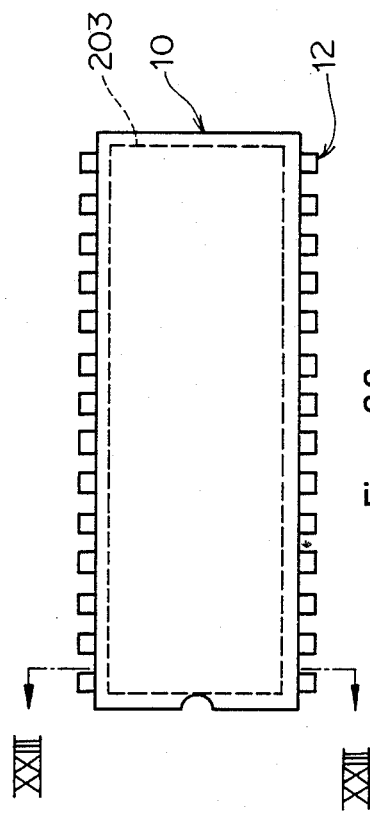
FIG. 21 is a partial top view of a ninth embodiment of an electronic circuit assembly according to the present invention, wherein an edge of a projection is shown in phantom line.
Figure 22:
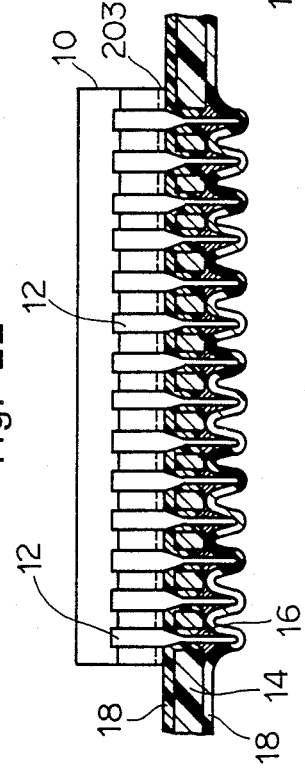
FIG. 22 is a side view, partially in cross-section, of the electronic circuit assembly shown in FIG. 21, wherein an under surface of an electronic circuit element is shown in phantom line.

FIGS. 21, 22 and 23 show a ninth embodiment of the present invention, which is similar to the fourth embodiment disclosed in FIGS. 11 and 12. The difference is that a projection 203 which is an integral part of the IC housing 10 and which depends downwardly from the periphery of the under surface of the IC housing 10 into contact with the printed circuit base plate 14 constitutes the spacer means. The projection 203 defines an enclosed space between the under surface of the IC housing 10 and the base plate 14.

Consequently, the projection 203 prevents the coating resin 18 from penetrating into the space defined by the projection 203. The coating resin 18 advantageously is 10 through 100 μm thick, and the height of the projection 203 is greater than the thickness of the coating resin 18. As a result, the predetermined distance between the under surface of the IC housing 10 and the opposing surface of the printed circuit base plate 14 is maintained by the spacer 20, and the connecting condition between the lead pins 12 and the printed circuit base plate 14 is not degraded.

Further, the projection 203 advantageously is tapered, so that the printed circuit base plate 14 is only in edge contact with the projection 203. As a result of the small area of contact, the IC housing 10 does not incur as much thermal damage.

It will be apparent to those skilled in the art that the projection 203 may have a wide bottom if the IC housing 10 is thermal durable.

Figure 25:
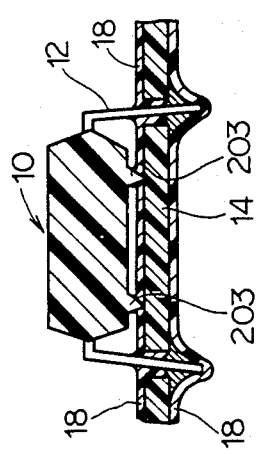
FIG. 25 is a cross-sectional view of the electronic circuit assembly shown in FIG. 24 taken along the line XXV—XXV.
Figure 24:
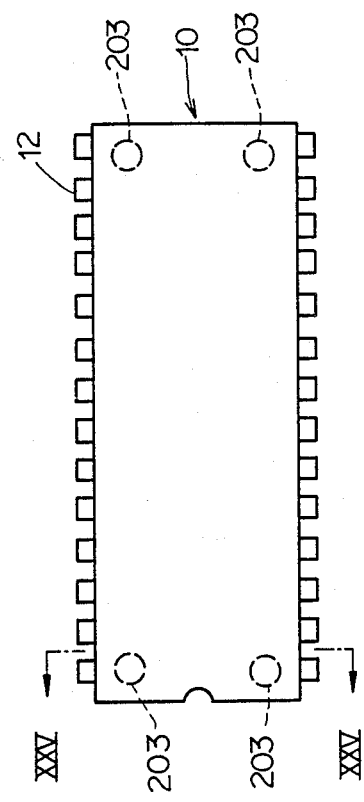
FIG. 24 is a partial top view of a tenth embodiment of an electronic circuit assembly according to the present invention, wherein a spacer is shown in phantom line.

FIGS. 24 and 25 show a tenth embodiment of the present invention, which is very similar to the ninth embodiment described above. The difference is that the projections 203 constituting the spacer 20 comprises four cones 203. Each cone 203 is located at a corner of the IC housing 10 and projects downwardly from the under surface of the IC housing 10. Further, each cone 203 has a point surface in contact with the printed circuit base plate 14, and is integrally formed with the IC housing 10.

Consequently, the IC housing 10 is securely supported by the cones 203 and a predetermined distance is defined between the under surface of the IC housing 10 and the printed circuit base plate 14.

Advantageously, the thickness of the coating resin 18 is less than the predetermined distance defined by the cones 203, such that the coating resin 18 does not contact the under surface of the IC housing 10. However, even if the coating resin 18 does contact the under surface of the IC housing 10, the cones 203 prevent the IC housing 10 from being pulled by the shrinking of the coating resin 18 during the drying process. As a result, the lead pins 12 are not subjected to as much stress caused by the shrinking of the coating resin.

Therefore, the predetermined distance between the under surface of the IC housing 10 and the opposing surface of the printed circuit base plate 14 is maintained by the spacer 20, and the connecting condition between the lead pins 12 and the printed circuit base plate 14 is not degraded.

Figure 27:
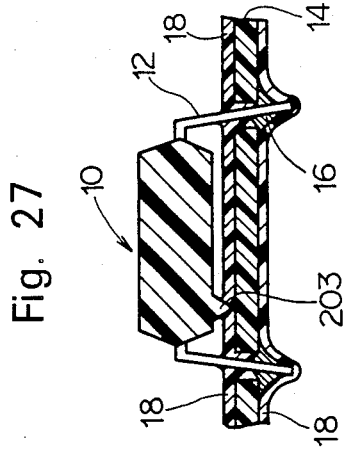
FIG. 27 is a cross-sectional view of the electronic circuit assembly shown in FIG. 26 taken along the line XXVII—XXVII.
Figure 26:
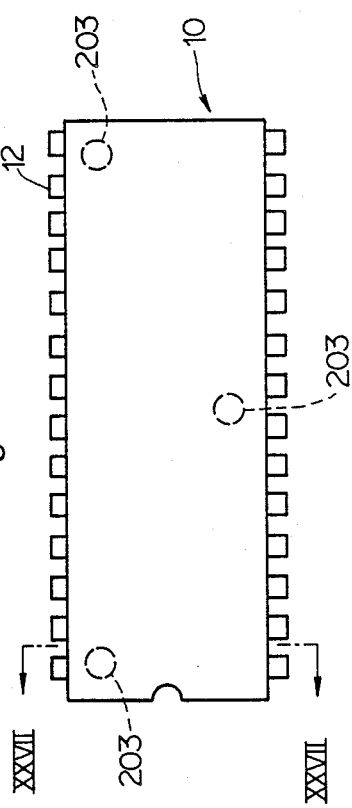
FIG. 26 is a top view of an eleventh embodiment of an electronic circuit assembly according to the present invention, wherein a spacer is shown in phantom line.

FIGS. 26 and 27 show a eleventh embodiment of the present invention, which is very similar to the tenth embodiment described above. The difference is that the projections 203 constituting the spacer 20 comprise three cones 203, which are respectively located at the center adjacent one side of the IC housing 10, and at the corners of another side of the IC housing 10.

Figure 29:
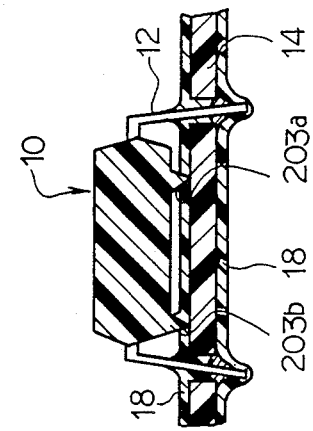
FIG. 29 is a cross-sectional view of the electronic circuit assembly shown in FIG. 28 taken along the line XXIX—XXIX.
Figure 28:
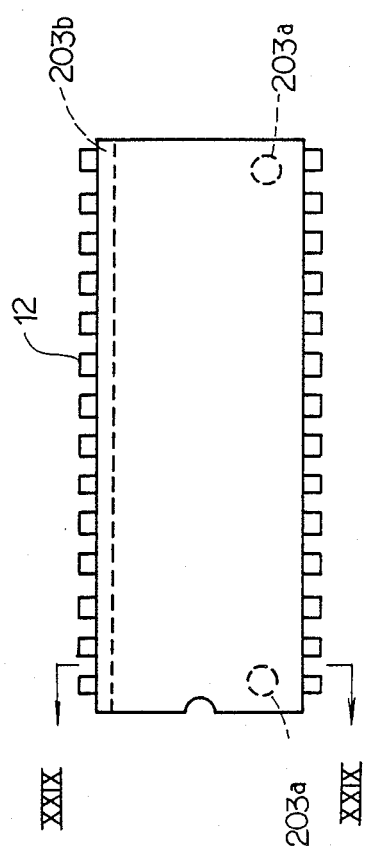
FIG. 28 is a partial top view of a twelfth embodiment of an electronic circuit assembly according to the present invention, wherein a spacer is shown in phantom line.

FIGS. 28 and 29 show a twelfth embodiment of the present invention, which is very similar to the tenth embodiment disclosed in FIGS. 24 and 25. The difference is that the projections 203 constituting the spacer 20 comprise two cones 203a and a slender elongate member 203b. The two cones 203a are respectively located at corners of one side of the IC housing 10, and the slender member 203b is located along the other side of the IC housing 10. The slender member 203 is tapered, as shown, so as to define a distal edge in contact with the base plate 14. Therefore, the predetermined distance between the under surface of the IC housing 10 and the opposing surface of the printed circuit base plate 14 is maintained by the spacer 20, and the connecting condition between the lead pins 12 and the printed circuit base plate 14 is not degraded.

FIGS. 30, 31 and 32 show a thirteenth embodiment of the present invention, which is similar to the ninth embodiment disclosed in FIGS. 21, 22 and 23. The difference is that a projection 203 and a plurality of recesses 204 constitute the spacer 20. The recesses 204 are formed in, and the projection 203 extends downwardly from, the under surface of the IC housing 10. As shown in FIG. 32, the projection 203 does not contact the printed circuit base plate 14, but does contact the coating resin 18. A space is defined between the projection 203, the recesses 204 and the coating resin 18, because air is located in the space which prevents the coating resin 18 from reaching to the under surface of the recesses 204. Even if the thickness of the coating resin 18 is greater than the spacing defined between the projection 203 and the printed circuit base plate 14, the coating resin 18 does not reach the under surface of the recesses 204.

When the coating resin 18 shrinks during the drying process, the coating resin 18 pulls the IC housing 10 downwardly. Consequently, the lead pins 12 are subjected to a load or stress caused by the shrinking of the coating resin 18, which is proportional to the area of the projection 203 which is in contact with the coating resin 18.

Figure 33:
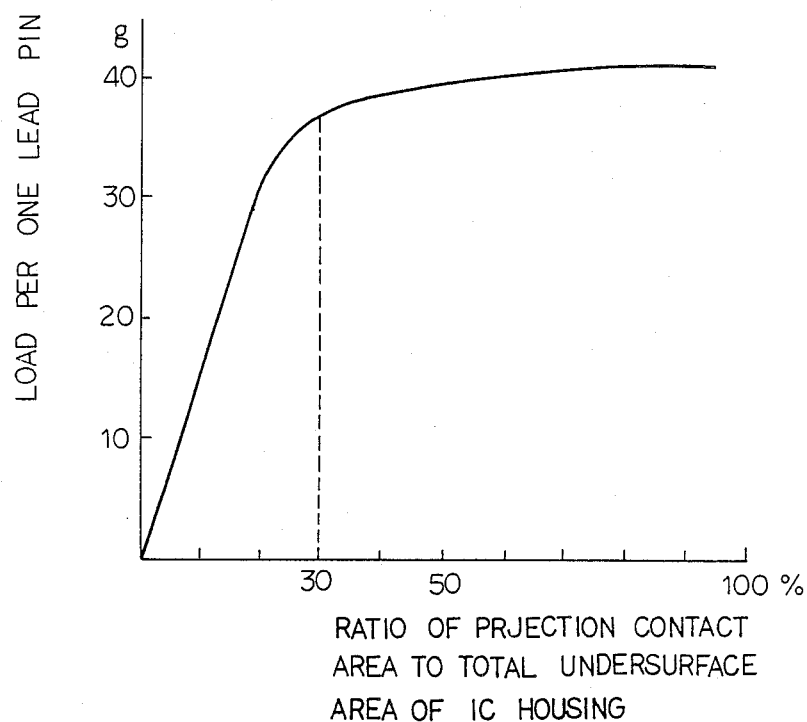
FIG. 33 is a graph showing the relationship between load per one lead pin and a ratio of a projecting area and a total under surface of an IC housing.

FIG. 33 shows the relationship which applicant discovered between the load per one lead pin and a ratio of the projection contact area and the total area of the under surface of the IC housing 10. As shown in FIG. 33, when the ratio of the projection contact area is greater than 30%, the load per one lead pin is almost 40, but when the projection contact area is less than 30% of the total area of the IC housing 10, the load per one lead pin decreases markedly. Accordingly, the projection contact area should be less than 30% of the total area in order to reduce the load on the lead pins, thereby allowing the load per one lead pin to be less than the allowable stress of the lead pins 12. As a result, the connecting condition between the lead pins 12 and the printed circuit base plate 14 is not degraded.

Figure 35:
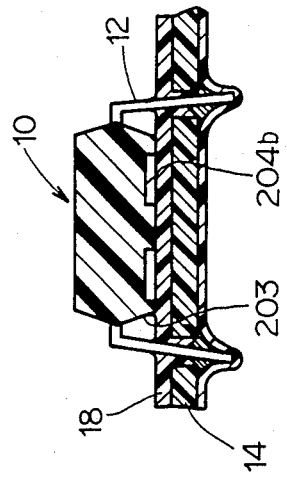
FIG. 35 is a cross-sectional view of the electronic circuit assembly shown in FIG. 34 taken along the line XXXV—XXXV.
Figure 34:
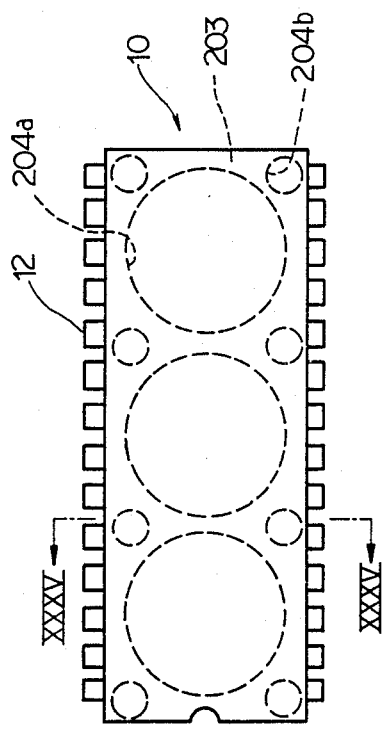
FIG. 34 is a partial top view of a fourteenth embodiment of an electronic circuit assembly according to the present invention, wherein recesses are shown in phantom line.

FIGS. 34 and 35 show a fourteenth embodiment of the present invention, which is very similar to the thirteenth embodiment described above. The difference is that the recesses 204 comprise large recesses 204a and smaller recesses 204b. Consequently, the contact area of projection 203 is less than that of the thirteenth embodiment, which ensures that the load per one lead pin is less than the allowable stress of the lead pins 12, and the connecting condition between the lead pins 12 and the printed circuit base plate 14 is not degraded.

Figure 37:
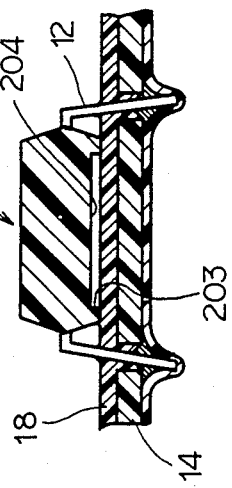
FIG. 37 is a cross-sectional view of the electronic circuit assembly shown in FIG. 36 taken along the line XXXVII—XXXVII.
Figure 36:
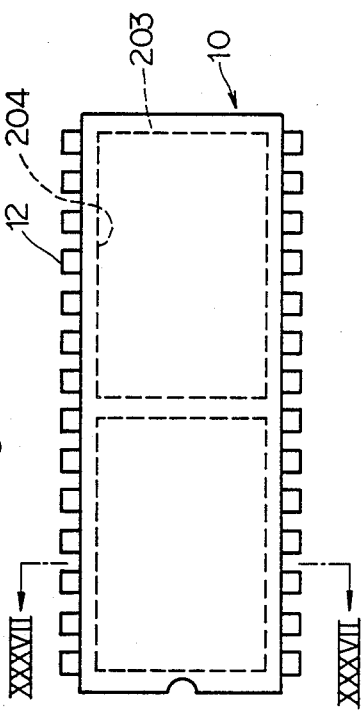
FIG. 36 is a partial top view of a fifteenth embodiment of an electronic circuit assembly according to the present invention, wherein recesses are shown in phantom line.

FIGS. 36 and 37 show a fifteenth embodiment of the present invention, which is very similar to the thirteenth embodiment disclosed in FIGS. 30, 31 and 32. The difference is that the recesses 204 comprise two rectangular recesses. The resulting rectangular projection 203 prevents the coating resin 18 from moving from one recess 204 to the other during the drying process of the coating resin 18.

Figure 39:
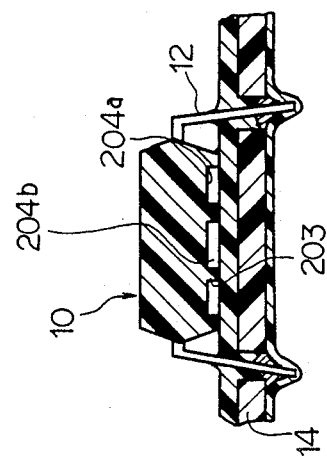
FIG. 39 is a cross-sectional view of the electronic circuit assembly shown in FIG. 38 taken along the line XXXIX—XXXIX.
Figure 38:
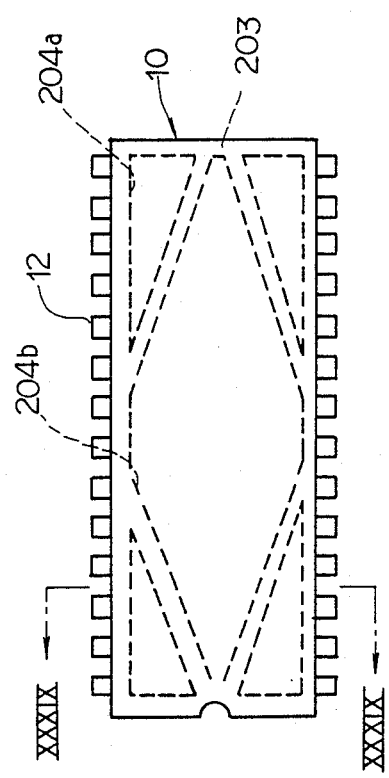
FIG. 38 is a partial top view of a sixteenth embodiment of an electronic circuit assembly according to the present invention, wherein recesses are shown in phantom line.

FIGS. 38 and 39 show a sixteenth embodiment of the present invention, which is very similar to the fifteenth embodiment described above. The difference is that the recesses 204 comprise triangular recesses 204a and a central rhomboidal recess 204b.

Figure 41:
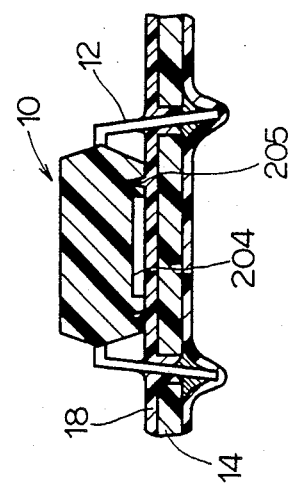
FIG. 41 is a cross-sectional view of the electronic circuit assembly shown in FIG. 40 taken along the line XXXXI—XXXXI.
Figure 42:
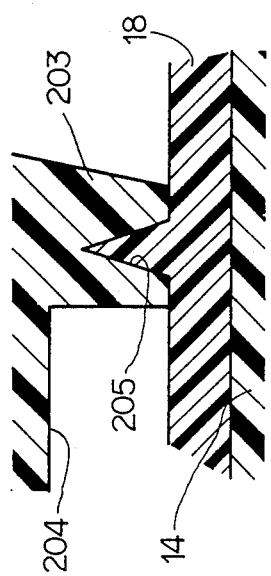
FIG. 42 is an enlarged cross-sectional view of a projection of the IC housing shown in FIG. 40.
Figure 40:
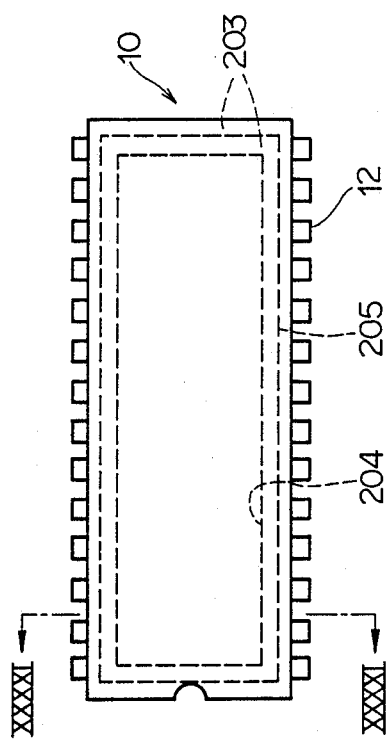
FIG. 40 is a partial top view of a seventeenth embodiment of an electronic circuit assembly according to the present invention, wherein a recess and a groove are shown in phantom line.

FIGS. 40, 41 and 42 show a seventeenth embodiment of the present invention, which is very similar to the fifteenth embodiment disclosed in FIGS. 36 and 37. The difference is a groove 205 is formed in the bottom of the projection 203 midway between the edges of the projection. The coating resin 18 is introduced into the groove 205 during the drying process of the coating resin 18. Consequently, the thickness of the coating resin 18 located within the recess 204 is reduced by the introduction of the coating resin 18 into the groove 205. Even if the coating resin 18 initially contacts the under surface of the recess 204, the coating resin 18 is removed from contact therewith because of the introduction of the coating resin 18 into the groove 205 during the drying process.

In addition, the contact area of the projection 203 is made less than 30% of the total area of the IC housing 10, so that the load per one lead pin is less than the allowable stress of the lead pins 12, and the connecting condition between the lead pins 12 and the printed circuit base plate 14 is not degraded.

Figure 44:
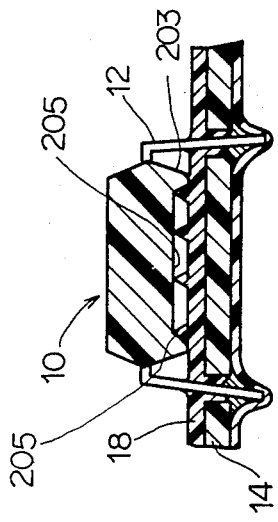
FIG. 44 is a cross-sectional view of the electronic circuit assembly shown in FIG. 43 taken along the line XXXXIV—XXXXIV.
Figure 43:
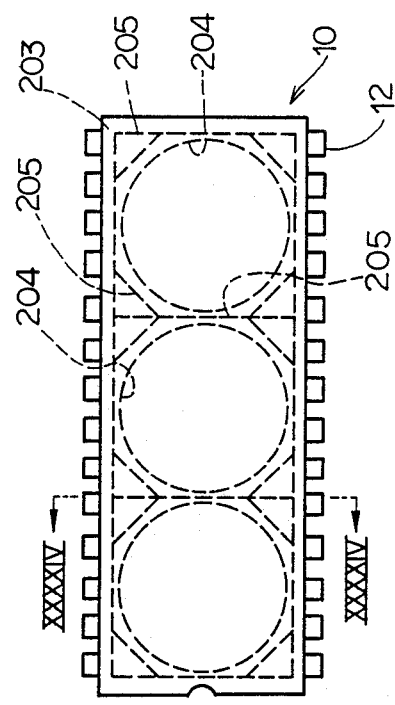
FIG. 43 is a partial top view of an eighteenth embodiment of an electronic circuit assembly according to the present invention, wherein recesses and grooves are shown in phantom line.

FIGS. 43 and 44 show an eighteenth embodiment of the present invention, which is very similar to the thirteenth embodiment disclosed in FIGS. 30, 31 and 32. The difference is that grooves 205 are formed in the projection 203, as shown, and the coating resin 18 is introduced into the grooves 205 during the drying process of the coating resin 18. In addition, the contact area of the projection 203 is made less than 30% of the total area of the IC housing 10 so that the load per one lead pin is less than the allowable stress of the lead pins 12, and the connecting condition between the lead pin 12 and the printed circuit base plate 14 is not degraded.

Figure 46:
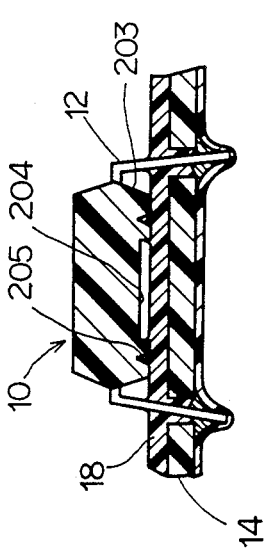
FIG. 46 is a cross-sectional view of the electronic circuit assembly shown in FIG. 45 taken along the line XXXXVI—XXXXVI.
Figure 45:
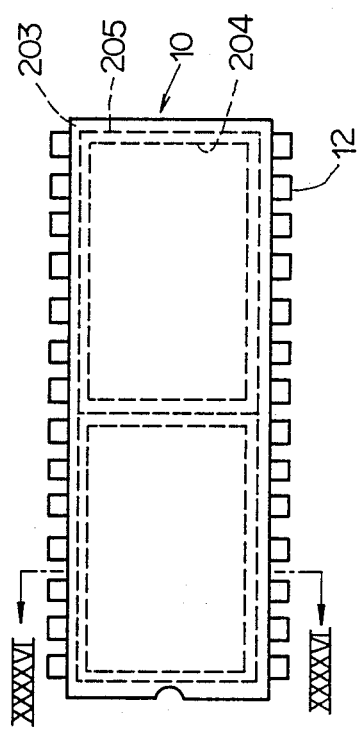
FIG. 45 is a partial top view of a nineteenth embodiment of an electronic circuit assembly according to the present invention, wherein recesses and grooves are shown in phantom line.

FIGS. 45 and 46 show a nineteenth embodiment of the present invention, which is very similar to the fifteenth embodiment disclosed in FIGS. 36 and 37. The difference is that grooves 205 are formed in the projection 203, as shown, and the coating resin 18 is introduced into the grooves 205 during the drying process of the coating resin 18.

In addition, the contact area of the projection 203 is made less than 30% of the total area of the IC housing 10 so that the load per one lead pin is less than the allowable stress of the lead pins 12, and the connecting condition between the lead pins 12 and the printed circuit base plate 14 is not degraded.

Figure 48:
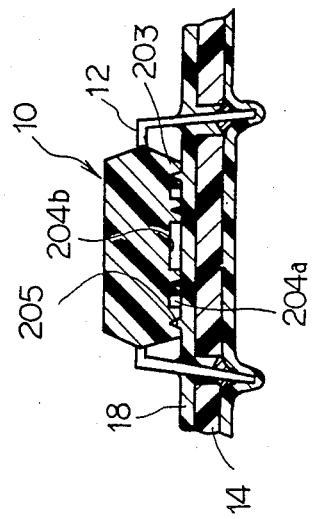
FIG. 48 is a cross-sectional view of the electronic circuit assembly shown in FIG. 47 taken along the line XXXXVIII—XXXXVIII.
Figure 47:
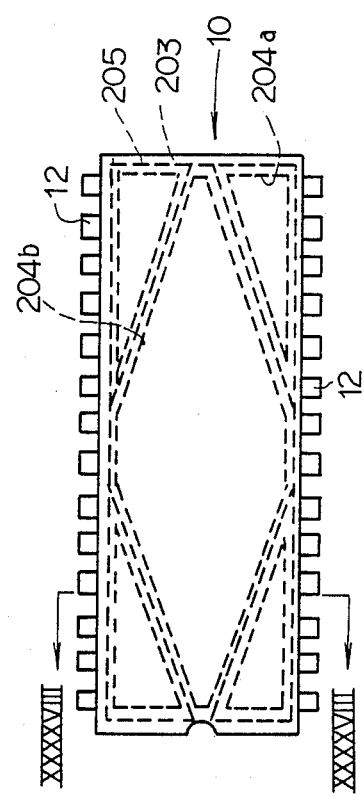
FIG. 47 is a top view of a twentieth embodiment of an electronic circuit assembly according to the present invention, wherein recesses and grooves are shown in phantom line.

FIGS. 47 and 48 show a twentieth embodiment of the present invention, which is very similar to the sixteenth embodiment disclosed in FIGS. 38 and 39. The difference is that grooves 205 are formed in the projection 203, as shown, and the coating resin 18 is introduced into the grooves 205 during the drying process of the coating resin 18. In addition, the contact area of the projection 203 is made less than 30% of the total area of the IC housing 10, so that the load per one lead pin is less than the allowable stress of the lead pins 12, and the connecting condition between the lead pins 12 and the printed circuit base plate 14 is not degraded.

As described herein, the present invention overcomes the shortcomings of the prior art by providing a spacer, either as a separate element or as an integral projection formed in the IC housing, located between an under surface of the IC housing and the printed circuit base plate.

While the present invention has been described in its preferred embodiments, it is to be understood that the invention is not limited thereto, and may be otherwise embodied within the scope of the following claims.

What is claimed is:

1. An electronic circuit assembly comprising:
   a printed circuit base plate;
   an electronic circuit element including a body portion and a plurality of lead pins extending from the body portion, said lead pins being electrically connected and secured to said printed circuit base plate, said body portion having an under surface which faces said printed circuit base plate and which is disposed a predetermined distance from said printed circuit base plate;

a spacer means having an uncompressed thickness which is greater than said predetermined distance, the spacer means being positioned between said printed circuit base plate and said body portion of said electronic circuit element, at least portions of said spacer means contacting said printed circuit base plate and the body portion to support said body portion, said spacer means including means for positioning said electronic circuit element; and a coating means applied to said printed circuit base plate, a portion of said spacer means and portions of said lead pins for protecting said printed circuit base plate, a portion of said spacer means and portions of said lead pins of said electronic circuit element, said coating means comprising a material which shrinks when subjected to heating or cooling, said spacer means preventing said coating means from contacting said under surface during application of said coating means, said spacer means protecting said lead pins from strain caused by shrinkage of said coating means.

2. The electronic circuit assembly of claim 1, wherein said spacer means is made of an elastomeric material.

3. The electronic circuit assembly of claim 2, wherein said spacer means has a frame shape defining an edge surface which contacts a peripheral portion of an under surface of said electronic circuit element body portion.

4. The electronic circuit assembly of claim 2, wherein said spacer means has a frame shape defining an edge surface which contacts a peripheral portion of a side surface of said electronic circuit element body portion.

5. An electronic circuit assembly comprising:

a printed circuit base plate;

an electronic circuit element including a body portion and a plurality of lead pins extending from the body portion, said lead pins being electrically connected and secured to said printed circuit base plate, said body portion having an under surface which faces said printed circuit baase plate and which is disposed a predetermined distance from said printed circuit base plate;

spacer means disposed between said printed circuit base plate and said electronic circuit element body portion, said spacer means including stress absorbing means and protector means, the stress absorbing means disposed between said body portion and said printed circuit base plate, and contacting both said printed circuit base plate and said body portion, said protector means mounted on at least one side of said stress absorbing means and defining a space between said printed circuit base plate and said body portion, said protector means covering an outer peripheral side of said stress absorbing means; and coating means applied to said printed circuit base plate, a portion of said protector means and portions of said lead pins for protecting said printed circuit base plate, a portion of said protector means and portions of said lead pins of said electronic circuit element, said coating means comprising a material which shrinks when subjected to heating or cooling said protector means preventing said coating means from penetrating into said space defined by said protector means during application of said coating means and said spacer means protecting said lead pins from thermal and mechanical strain caused by shrinkage of said coating means.

6. The electronic circuit assembly of claim 5, wherein said stress absorbing means comprises a plate which contacts substantially the entire under surface of said electronic circuit element body portion.

7. The electronic circuit assembly of claim 5, wherein said stress absorbing means has a frame shape defining an edge surface which contacts a peripheral portion of an under surface of said electronic circuit element body portion.

8. The electronic circuit assembly of claim 5, wherein said stress absorbing means includes a plurality of columnar support members disposed between said electronic circuit element body portion and said printed circuit base plate.

9. The electronic circuit assembly of claim 5, wherein said stress absorbing means includes a columnar support member located in the vicinity of a first side of said electronic circuit element body portion, and an elongate support member located in the vicinity of a second side of said body portion opposing said first side.

10. An electronic circuit assembly comprising;

a printed circuit base plate;

an electronic circuit element including a body portion and a plurality of lead pins extending from said body portion, the lead pins being electrically connected and secured to said printed circuit base plate, said body portion having an under surface which faces said printed circuit base plate and which is disposed a predetermined distance from said printed circuit base plate;

spacer means integrally formed with said body portion for providing space between said printed circuit base plate and the body portion, the spacer means providing a reduced area of contact between said body portion and said printed circuit base plate; and a coating means applied to said printed circuit base plate and portions of said lead pins for protecting said printed circuit base plate and portions of said lead pins of said electronic circuit element, said coating means comprising a material which shrinks when subjected to heating or cooling said spacer means protecting said lead pins from mechanical strain caused by shrinkage of said coating means.

11. The electronic circuit assembly of claim 10, wherein said spacer means defines a base plate contacting edge surface which extends substantially entirely around a peripheral edge portion of an under surface of said electronic circuit element body portion.

12. The electronic circuit assembly of claim 10, wherein said spacer means includes a plurality of cones depending from an under surface of said electronic circuit element body portion and contacting said printed circuit base plate.

13. The electronic circuit assembly of claim 10, wherein said spacer means includes an elongate member depending from an under surface of said electronic circuit element body portion.

14. The electronic circuit assembly of claim 10, wherein said spacer means includes a plurality of pointed members depending from an under surface of the body portion of said electronic circuit element body portion and contacting said printed circuit base plate.

15. The electronic circuit assembly of claim 10, wherein said spacer means includes an elongate member and a cone member, said elongate member being located in the vicinity of a first side of said electronic circuit element body portion, said cone member being located in the vicinity of a second side of said base portion opposing said first side, said elongate member and said cone member contacting said base plate.

16. The electronic circuit assembly of claim 10, wherein said spacer means depends from an under surface of said electronic circuit element body portion and defines at least one contacting surface which contacts said coating means coated on said printed circuit base plate such that the ratio of the area of said contacting surface to the entire under surface of said body portion is equal to or less than 30%.

17. The electronic circuit assembly of claim 16, wherein said spacer means includes at least one groove in said contacting surface of said spacer means, and said coating means penetrates into said at least one groove.

18. An electronic circuit assembly comprising:
a printed circuit base plate;
an electronic circuit element including a body portion and a plurality of lead pins extending from said body portion, the lead pins being electrically connected and secured to said printed circuit base plate, the body portion having an under surface which faces said printed circuit base plate and which is disposed a predetermined distance from said printed circuit base plate;
spacer means positioned between said printed circuit base plate and said body portion for supporting said electronic circuit element on said printed circuit base plate; and
coating means applied to said printed circuit base plate and portions of said lead pins for protecting said printed circuit base plate and portions of said lead pins of said electronic circuit element, said coating means comprising a material which shrinks when subjected to heating or cooling, said spacer means preventing said coating means from contacting said under surface during application of said coating means, the spacer means protecting said lead pins from strain caused by shrinkage of said coating means.

19. The electronic circuit assembly of claim 10, wherein said coating means surrounds an outer periphery of said spacer means.

20. The electronic circuit assembly of claim 10, wherein said spacer means is mounted on said coating means.

* * * * *